United States Patent
Goto

(10) Patent No.: US 6,246,065 B1
(45) Date of Patent: Jun. 12, 2001

(54) ELECTRON BEAM PROJECTION EXPOSURE APPARATUS

(75) Inventor: Susumu Goto, Tama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/145,647

(22) Filed: Sep. 2, 1998

(30) Foreign Application Priority Data

Sep. 4, 1997 (JP) .................................................. 9-239527

(51) Int. Cl.[7] .................................................. H01J 37/302
(52) U.S. Cl. .................................................. 250/492.23
(58) Field of Search ........................ 250/492.23; 313/310

(56) References Cited

U.S. PATENT DOCUMENTS

| | | | |
|---|---|---|---|
| 4,091,311 | * 5/1978 | Mendelsohn et al. | 315/382 |
| 4,939,371 | 7/1990 | Goto | 250/397 |
| 5,500,527 | * 3/1996 | Zarubin | 250/306 |
| 5,780,960 | * 7/1998 | Vickers | 313/310 |
| 6,037,601 | * 3/2000 | Okunuki | 250/492.23 |

OTHER PUBLICATIONS

J.A. Liddle, et al., "The Scattering With Angular Limitation in Projection Electron–Beam Lithography (SCALPEL) System", *Jpn. J. Phys.*, vol. 34, Part 1, No. 12B, Dec. 1995, pp. 6663–6671.

* cited by examiner

Primary Examiner—Jack Berman
(74) Attorney, Agent, or Firm—Fitzpatrick, Cella, Harper & Scinto

(57) ABSTRACT

This invention provides an electron beam projection exposure apparatus which can obtain a large irradiation width while maintaining an electron beam intensity required for exposure. An electron beam emitted by an electron gun (1) is transmitted through a condenser lens (2) and field lens (3), and illuminates a mask (4). The electron beam transmitted through the mask (4) is imaged and irradiated onto a wafer (7) via reduction projection lenses (5, 6), thus forming a pattern on the mask (4) on the wafer (7) by exposure. The electron gun (1) has an electron source, an electron emission surface of which has a circularly recessed central portion, and a ring-shaped electron beam emitted by the peripheral portion of the electron emission surface is used in exposure.

11 Claims, 7 Drawing Sheets

ELECTRON BEAM PROJECTION EXPOSURE APPARATUS

BACKGROUND OF THE INVENTION

1. Field of the Invention

The present invention relates to an electron beam exposure technique in a pattern exposure process in the manufacture of semiconductor elements and, more particularly, to an electron beam projection transfer exposure apparatus which assures high use efficiency of electron beams and has high productivity.

2. Description of the Related Art

In the manufacturing process of semiconductor memory elements, light exposure that can assure high productivity is used. However, in the manufacture of semiconductor memory elements such as 1G and 4G DRAMs, which require processing an exposure pattern having a minimum line width of 0.2 μm or less, electron beam exposure with higher resolution is beginning to gain attention as an alternative exposure technique to light exposure.

In recent years, a transfer electron beam exposure apparatus which aims at improving productivity as compared to a conventional Gaussian or variable shaped electron exposure apparatus, i.e., an exposure apparatus which irradiates an electron beam onto a mask surface formed with a desired pattern and transfers the electron beam transmitted through the mask in a reduced scale to project the pattern on the mask onto a wafer, has been developed.

FIG. 7 shows the arrangement of a conventional electron beam projection exposure apparatus. In the conventional electron beam projection exposure apparatus shown in FIG. 7, an electron beam emitted by an electron gun 101 is condensed by a condenser lens 102 formed with a rectangular aperture 121, and uniformly illuminates the surface of a mask 104 via a field lens 103. As the mask 104, either a scattering type mask prepared by forming a scattering pattern for scattering the electron beam on a membrane that transmits the electron beam, or a stencil type mask prepared by forming an absorbing pattern for absorbing the electron beam on a membrane may be used. The electron beam which is neither scattered nor absorbed by the pattern on the mask 104 is imaged and irradiated on a wafer 107 via reduction projection lenses 105 and 106, thus forming an image of the pattern on the mask 104 onto the wafer 107 by exposure. Since the electron beam is transmitted through the rectangular aperture 121, an electron beam irradiation region 110 on the wafer 107 also has a rectangular shape, as shown in FIG. 8. The mask 104 is mounted on an X-Y stage which can be scanned in the X- and Y-directions, and the wafer 107 is mounted on a wafer stage. By scanning the X-Y stage in synchronism with the wafer stage, the entire surface of the wafer 107 is exposed.

One of the major factors that determine the productivity of the above-mentioned electron beam projection exposure apparatus is the exposure area (irradiation area) of an electron beam on the wafer surface. Especially, the exposure width (stripe width) W (see FIG. 8) of an electron beam in a direction perpendicular to the scanning direction of the wafer stage is an important factor. The exposure area is determined by off-axis aberrations of a projection lens of an electron optical system. In the manufacture of 1G or 4G DRAMs, the allowable value of the blur amount of an electron beam on the exposure surface is 20 to 30 nm. Hence, the allowable value of the blur amount due to aberrations of the electron optical system must be set to be equal to or smaller than this value, and a status quo numerical value example of the exposure area is around 0.25 mm×0.25 mm. The throughput in this case is five 8" wafers/hour, and sufficient performance is not obtained in terms of productivity (J. Alexander Liddle et al., Jpn. J. Appl. Phys. Vol. 34 (1995) pp. 6663–6671).

As for the intensity of the electron beam, the electron gun requires an emittance of around $10^{-5}$ to $10^{-4}$ (cm•rad) if off-axis aberrations can be reduced and the exposure area is several ten mm square. This value is one to two orders of magnitudes larger than that obtained by a LaB6 emitter electron gun used in the electron beam exposure apparatus. Therefore, when the exposure region is broadened while prescribed current density conditions of the electron gun determined by the resist sensitivity and stage scanning speed are satisfied, the intensity of the electron beam is limited by the emittance of the electron gun. Hence, a sufficiently high electron beam intensity cannot be obtained if the exposure region is broadened.

As described above, in the conventional electron beam exposure apparatus, it is hard to broaden the exposure region while maintaining the electron beam intensity required for obtaining a throughput with high productivity.

SUMMARY OF THE INVENTION

The present invention has been made in consideration of the above situation, and has as its object to provide an electron beam projection exposure apparatus which can obtain a large exposure width while maintaining an electron beam intensity required for exposure.

An electron beam projection exposure apparatus according to one aspect of the present invention comprises an electron gun, and a projection lens for projecting, onto a wafer, an electron beam which has been emitted by the electron gun and transmitted through a mask, and an intensity distribution of the electron beam emitted by the electron gun in a section perpendicular to an optical axis includes a ring-shaped region as a high intensity region.

According to a preferred embodiment of the present invention, the electron gun preferably has an electron source, an electron emission surface of which has a circularly recessed central portion.

According to a preferred embodiment of the present invention, the electron gun preferably has an electron source, an electron emission surface of which has a circularly recessed central portion and a ring-shaped peripheral portion.

According to a preferred embodiment of the present invention, the electron beam projection exposure apparatus preferably further comprises a slit member which is inserted between the electron gun and mask, and has a slit for shaping a sectional shape of the electron beam emitted by the electron gun.

According to a preferred embodiment of the present invention, the slit preferably has an arcuated shape.

According to a preferred embodiment of the present invention, the slit preferably has a shape defined by two arcs which substantially have the optical axis as a center.

According to a preferred embodiment of the present invention, the electron beam projection exposure apparatus preferably further comprises an electron optical system which is inserted between the electron gun and mask and irradiates an image formed by the electron beam group transmitted through the slit onto the mask while magnifying the image to a predetermined size.

According to a preferred embodiment of the present invention, the electron optical system preferably includes a condenser lens and field lens.

According to a preferred embodiment of the present invention, the slit member is preferably located in the condenser lens.

According to a preferred embodiment of the present invention, the electron beam projection exposure apparatus preferably further comprises a control circuit for adjusting a size of an image formed by the electron beam irradiated onto the mask by controlling the electron optical system.

According to a preferred embodiment of the present invention, the electron beam projection exposure apparatus preferably further comprises a measurement device for measuring a current distribution of the electron beam which becomes incident at a position of the mask, and the control circuit operates on the basis of a measurement result of the measurement device.

According to a preferred embodiment of the present invention, the electron beam projection exposure apparatus preferably further comprises a bias circuit for adjusting a bias voltage to be applied to the electron gun.

According to a preferred embodiment of the present invention, the electron beam projection exposure apparatus preferably further comprises a measurement device for measuring a current distribution of the electron beam which becomes incident at a position of the mask, and the bias circuit operates on the basis of a measurement result of the measurement device.

Further objects, features and advantages of the present invention will become apparent from the following detailed description of embodiments of the present invention with reference to the accompanying drawings.

DETAILED DESCRIPTION OF THE PREFERRED EMBODIMENT

The preferred embodiment of the present invention will be described hereinafter with reference to the accompanying drawings.

Figure 1:
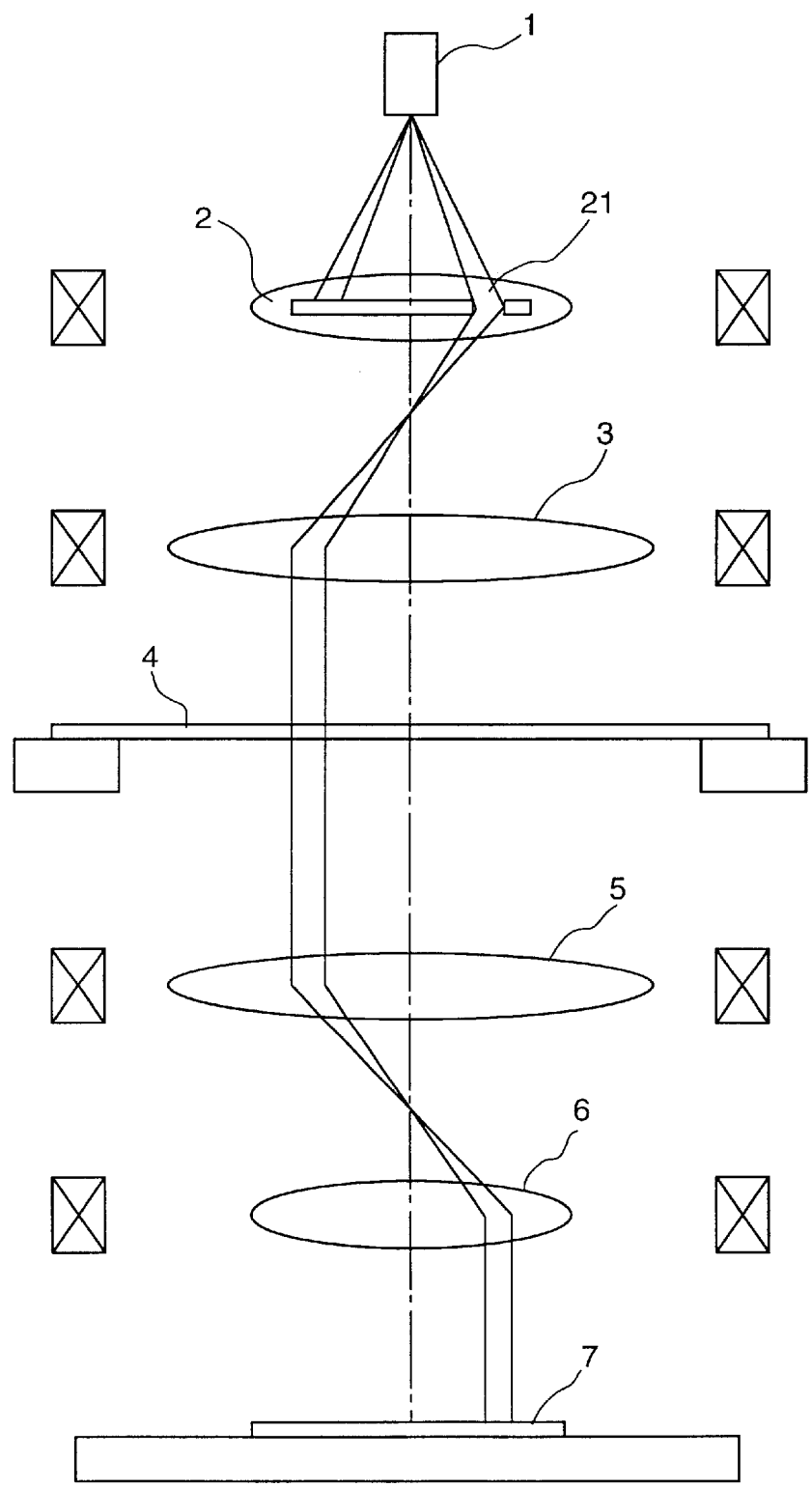
FIG. 1 is a view showing the arrangement of an electron beam projection exposure apparatus according to an embodiment of the present invention.

FIG. 1 is a view showing the arrangement of an electron beam projection exposure apparatus according to an embodiment of the present invention. As shown in FIG. 1, the electron beam projection exposure apparatus of this embodiment has an electron gun 1, an illumination electron optical illumination system which is composed of a condenser lens 2 and field lens 3 and irradiates an electron beam emitted by the electron gun 1 onto a mask 4, a mask stage (not shown) for holding the mask 4, an exposure electron exposure system which is constituted by a plurality of reduction projection lenses 5 and 6 and irradiates the electron beam transmitted through the mask 4 onto a wafer 7 in a reduced scale, and a wafer stage (not shown) for holding the wafer 7. The electron gun 1, condenser lens 2, field lens 3, and reduction production lenses 5 and 6 are coaxially arranged.

Figure 2:
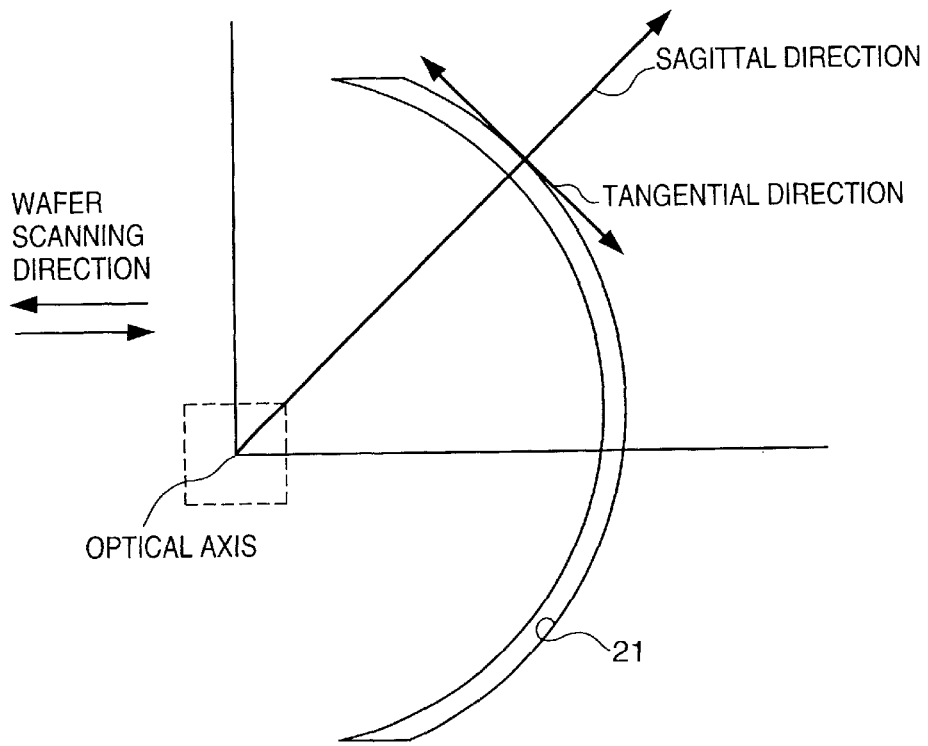
FIG. 2 is a view showing the shape of a slit of a condenser lens shown in FIG. 1.

The electron gun 1 emits a ring-shaped electron beam, and its arrangement and principle will be described later. The condenser lens 2 condenses an electron beam emitted by the electron gun 1, and has a slit member formed with a slit 21, which has an aperture of a desired size, in a portion of the irradiation region of the electron beam. The slit 21 preferably has an arcuated shape having the optical axis of the condenser lens 2 as the center, as shown in FIG. 2. With this slit, the electron beam that enters the condenser lens 2 is shaped into an arcuated shape and is condensed. The electron beam shaped into an arcuated shape by the condenser lens 2 is converted into a beam parallel to the optical axis by the field lens 3. The electron beam with a uniform intensity illuminates a region having a desired size on the surface of the mask 4 by the condenser lens 2 and field lens 3 that build the illumination electron optical system.

As the mask 4, a mask prepared by forming a scattering pattern for scattering the electron beam on a membrane (scattering type) or a mask prepared by forming an absorbing pattern for absorbing the electron beam on a membrane (stencil type) may be used. The electron beam which is neither scattered nor absorbed by the pattern on the mask 4 is imaged and irradiated on the wafer 7 via the reduction projection lenses 5and 6, thus forming an image of the pattern on the mask 4 onto the wafer 7 by exposure. Since the electron beam is transmitted through the arcuated slit 21, the irradiation region of the electron beam on the wafer 7 also has an arcuated shape. By scanning the mask stage in synchronism with the wafer stage, the entire surface of the wafer 7 is exposed.

Figure 3:
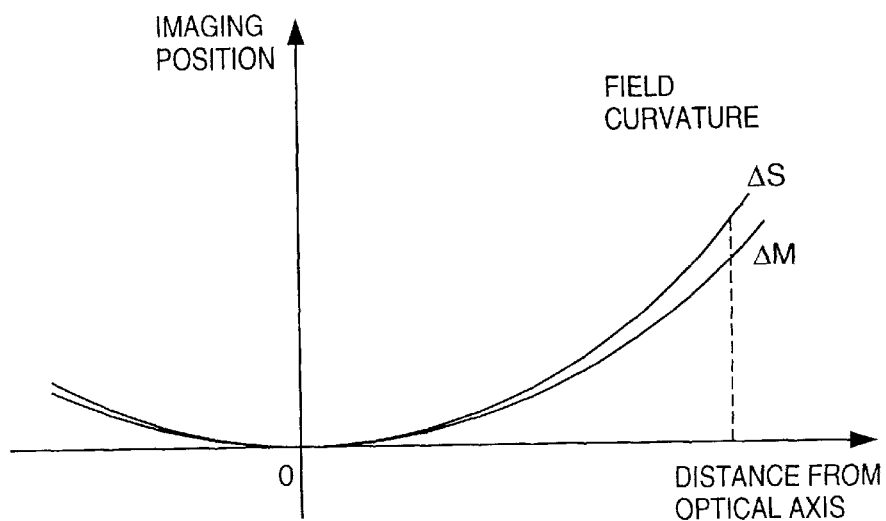
FIG. 3 is a graph for explaining the field curvature.

When an exposure pattern on the mask 4 is to be imaged on the wafer 7 using an electron beam having a broad exposure region, off-axis aberrations (especially, curvature of field, astigmatism) increase with increasing distance from the optical axis of the reduction projection lenses 5 and 6 (in the sagittal direction with respect to the optical axis). FIG. 3 shows field curvatures of field as a major factor of off-axis aberrations in correspondence with a meridional image surface ($\Delta M$) and sagittal image surface ($\Delta S$). As shown in FIG. 3, the imaging position shifts as the distance from the optical axis becomes larger.

For this reason, the condenser lens 2 preferably has the slit 21 with an arcuated shape, which has the optical axis of the lens 2 as the center. With this slit, the electron beam shaped into an arcuated shape can be output toward the position separated from the optical axis of the reduction projection lenses 5 and 6 in place of an electron beam near the optical axis (a region indicated by the broken line in FIG. 2) unlike in the prior art. The distance from the optical axis of the electron beam that enters the projection lenses 5 and 6 is made constant, and the field curvature becomes negligibly small. Hence, when the exposure region of the wafer 7 is set at the position of the least circle of confusion of the arcuated electron beam, blur of the electron beam due to curvature of field in an off-axis exposure region can be removed unlike in the prior art. As a consequence, the exposure region can be greatly broadened as compared to the prior art.

For example, when a projection lens having a reduction factor of ¼ is used, if the exposure region width is about 5 mm and the electron beam convergent angle is 0.1 mrad, the blur amount arising from curvature of field is as large as around 100 nm in the conventional electron beam projection exposure apparatus. By contrast, when the arcuated electron beam is used, if the width of the electron beam is about 100 μm and the radius of the electron beam is 1.5 mm, the blur amount due to field curvature can be reduced to 10 nm.

The electron gun 1 shown in FIG. 1 will be described in detail below.

Figure 4:
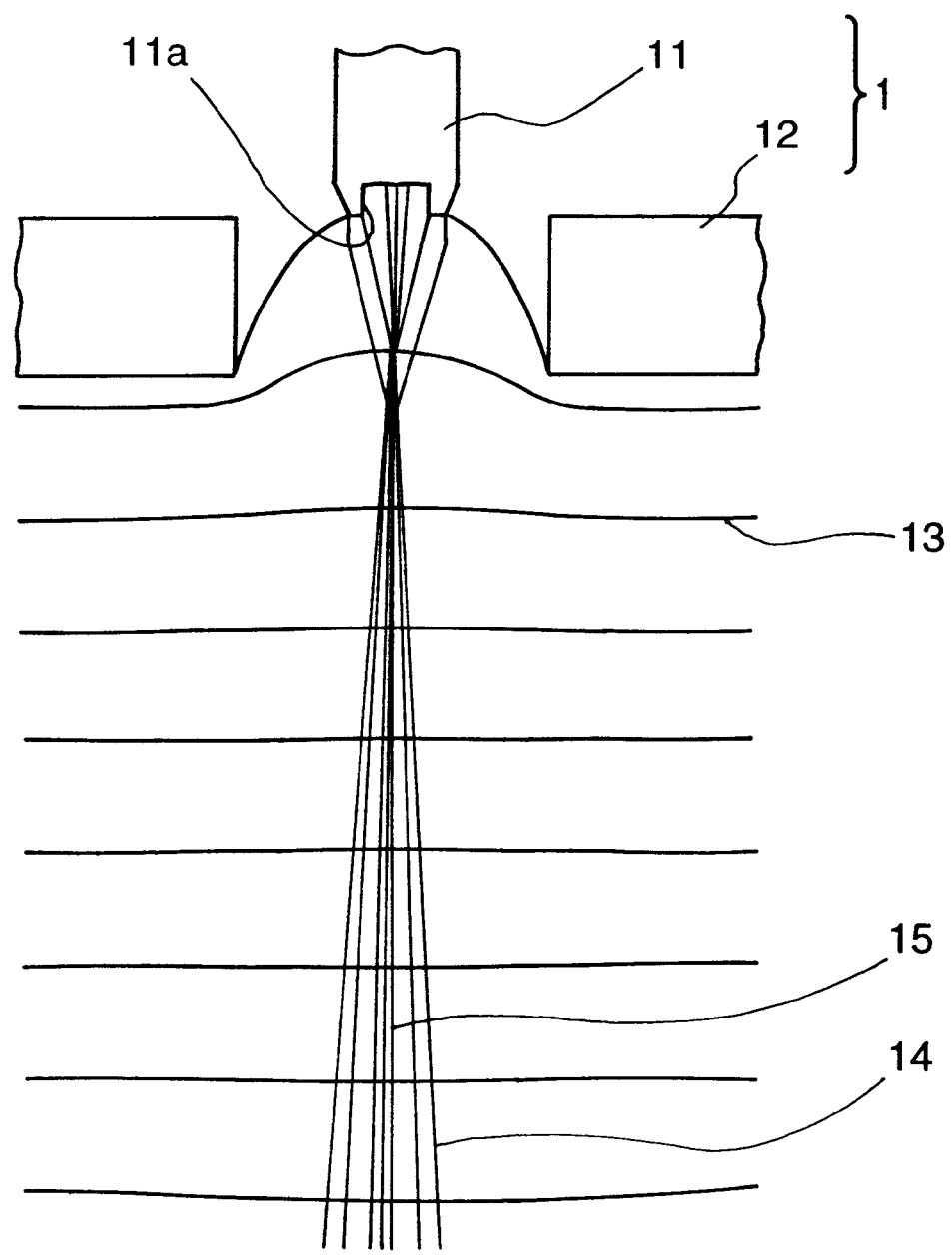
FIG. 4 is an enlarged view of an electron gun shown in FIG. 1 together with the electron beam path.

FIG. 4 is an enlarged view of the electron gun shown in FIG. 1 together with the electron beam path. As shown in FIG. 1, the electron gun 1 is constructed by an electron source 11, grid electrode 12, and acceleration electrode (not shown), and an electron emission surface 11a of the electron source 11 has a circularly recessed central portion and a ring-shaped peripheral portion.

When an operation voltage is applied to the electron gun 1, the electron gun 1 forms an electric field. In FIG. 4, reference numeral 13 denotes the distribution of equipotential lines at that time. The thermal electrons are emitted from the electron source 11, the electron trajectory is determined by the potential distribution formed by the gun electrodes configuration, thus forming a crossover image. Since the electron emission surface 11 has a circularly recessed central portion, the electrons emitted by the central portion form an on-axis beam 15, and the electrons emitted by the ring-shaped peripheral portion form a ring-shaped beam 14.

The intensity of electrons emitted is mainly determined by the electric field strength in the vicinity of the electron emission surface 11a of the electron source 11; as the electric field strength is higher, a larger current can be extracted without being limited by a space charge effect. As described above in the electron emission surface 11a having a circularly recessed central portion, the electric field strength of the central portion is considerably lower than the peripheral portion. Therefore, a current extracted from the central portion is small. Hence, the output efficiency of a ring-shaped electron beam (ring-shaped beam 14) that contributes to exposure can be improved. Also, the amount of electron beam irradiated onto a portion other than the slit 21 (FIG. 1) is reduced, and accumulation of heat and contamination can be suppressed.

Figure 5:
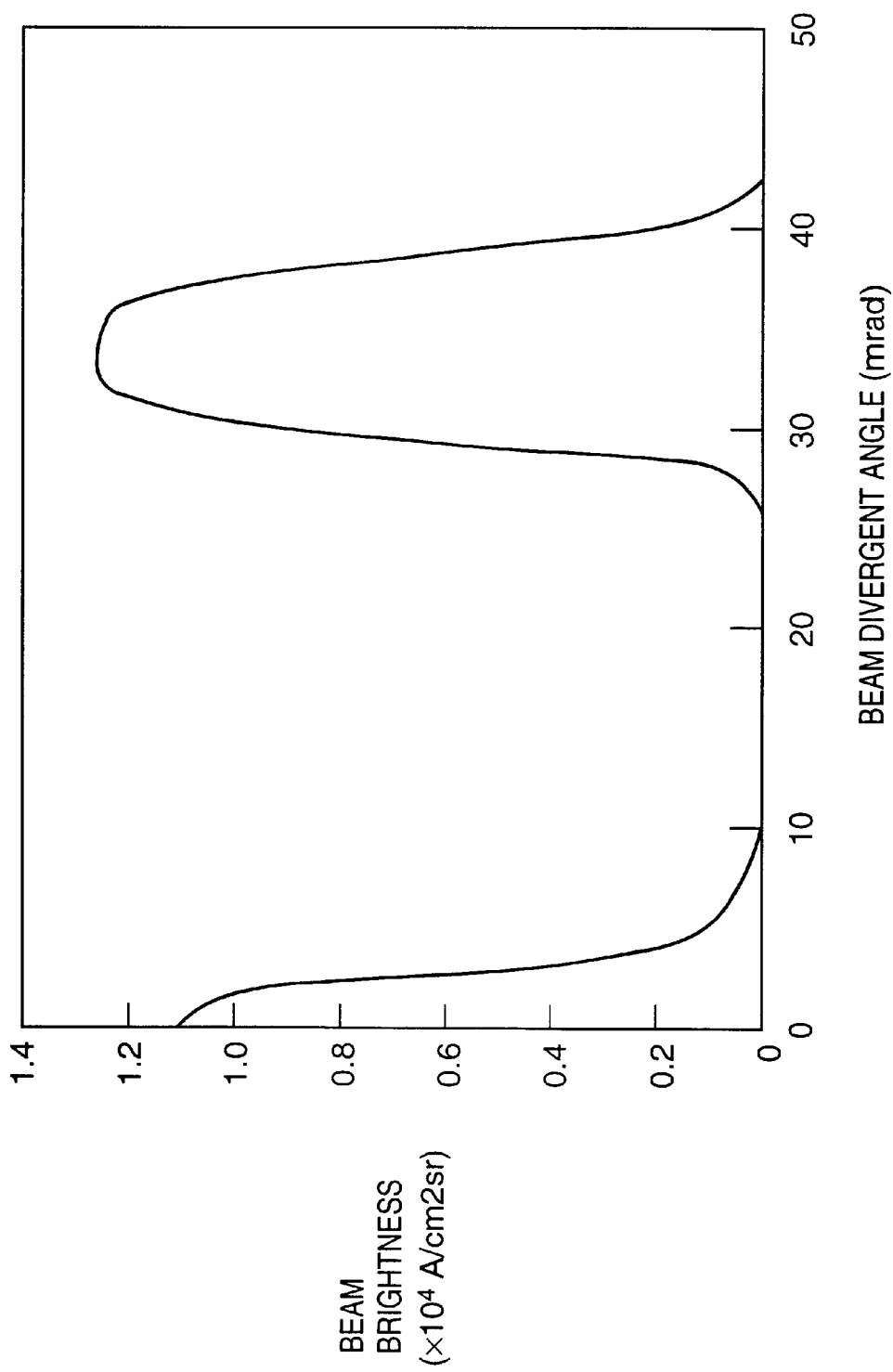
FIG. 5 is a graph showing the relationship between the beam divergent angle and beam brightness in the electron gun shown in FIG. 4.

FIG. 5 is a graph showing the relationship between the beam divergent angle and beam brightness in the electron gun shown in FIG. 4. In FIG. 5, a beam, the beam divergentangle of which is distributed within the range from 0 to 10 mrad, is the on-axis beam 15 shown in FIG. 4, and a beam, the beam divergent angle of which is distributed within the range from 25 to 42 mrad, is the ring-shaped beam 14 shown in FIG. 4. As can be seen from FIG. 5, the ring-shaped beam 14 has a brightness equivalent to that of the on-axis beam 15.

In the electron beam projection apparatus, an exposure time T is given by:

$$T = R/J \quad (1)$$

where R is the sensitivity of a photosensitive material, and J is the current density of an electron beam. Also, the current density J of the electron beam is given by:

$$J = I/S = \beta \times \pi \alpha^2 \quad (2)$$

where I is the electron beam current, S is the irradiation area, β is the brightness, and α is the electron beam convergent angle.

As can be understood from equations (1) and (2) above, in order to shorten the exposure time, the current density J must be increased, i.e., the brightness β of the electron beam must be increased. When the electron beam current I is constant, the brightness β decreases with increasing emittance (the product of the solid angle of the electron beam and the electron beam area). Hence, when the exposure region width (stripe width) remains the same as the conventional exposure method, the irradiation area of the electron beam can be reduced by forming a ring-shaped electron beam, and the current density J can be increased. When the ring-shaped beam 14 emitted from the peripheral portion of the electron emission surface 11a of the electron source 11 shown in FIG. 4 is used in exposure, the exposure region width ranging from several mm to several ten mm can be obtained at high luminance shown in FIG. 5, thus realizing an electron beam projection exposure apparatus with high productivity.

Figure 6:
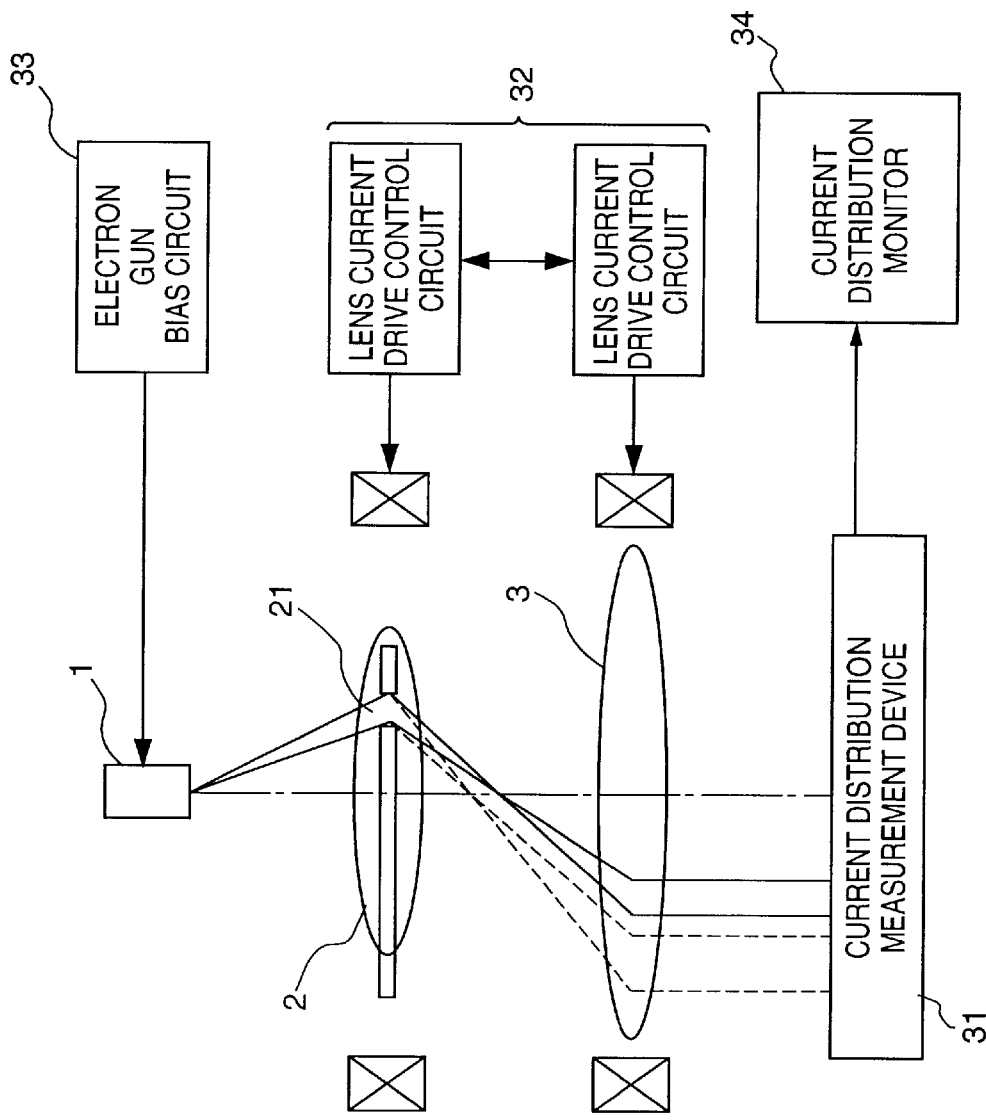
FIG. 6 is a view for explaining the method of setting the intensity of an arcuated electron beam in the present invention.
Figure 7:
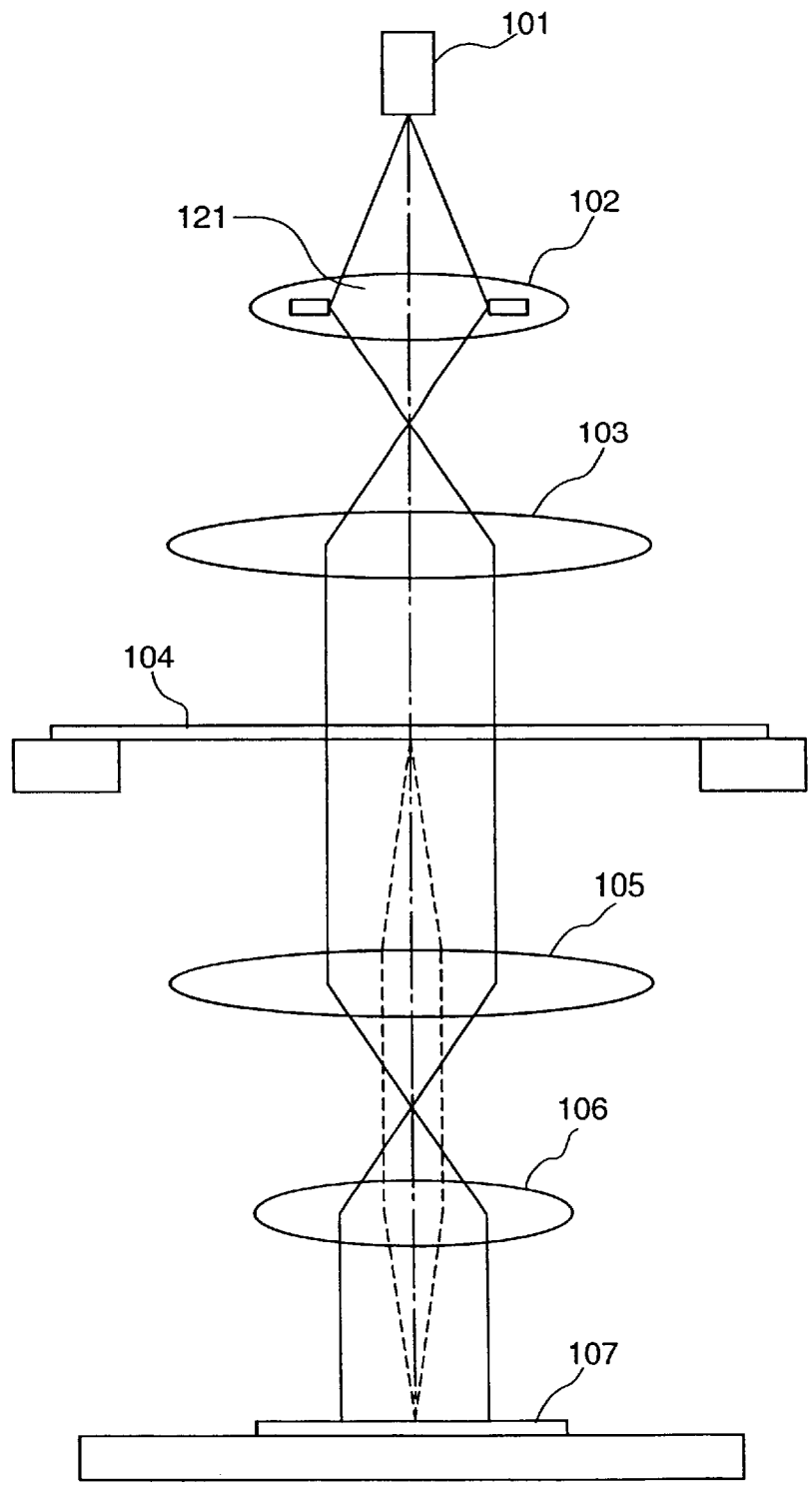
FIG. 7 is a view showing the arrangement of a conventional electron beam projection exposure apparatus.
Figure 8:
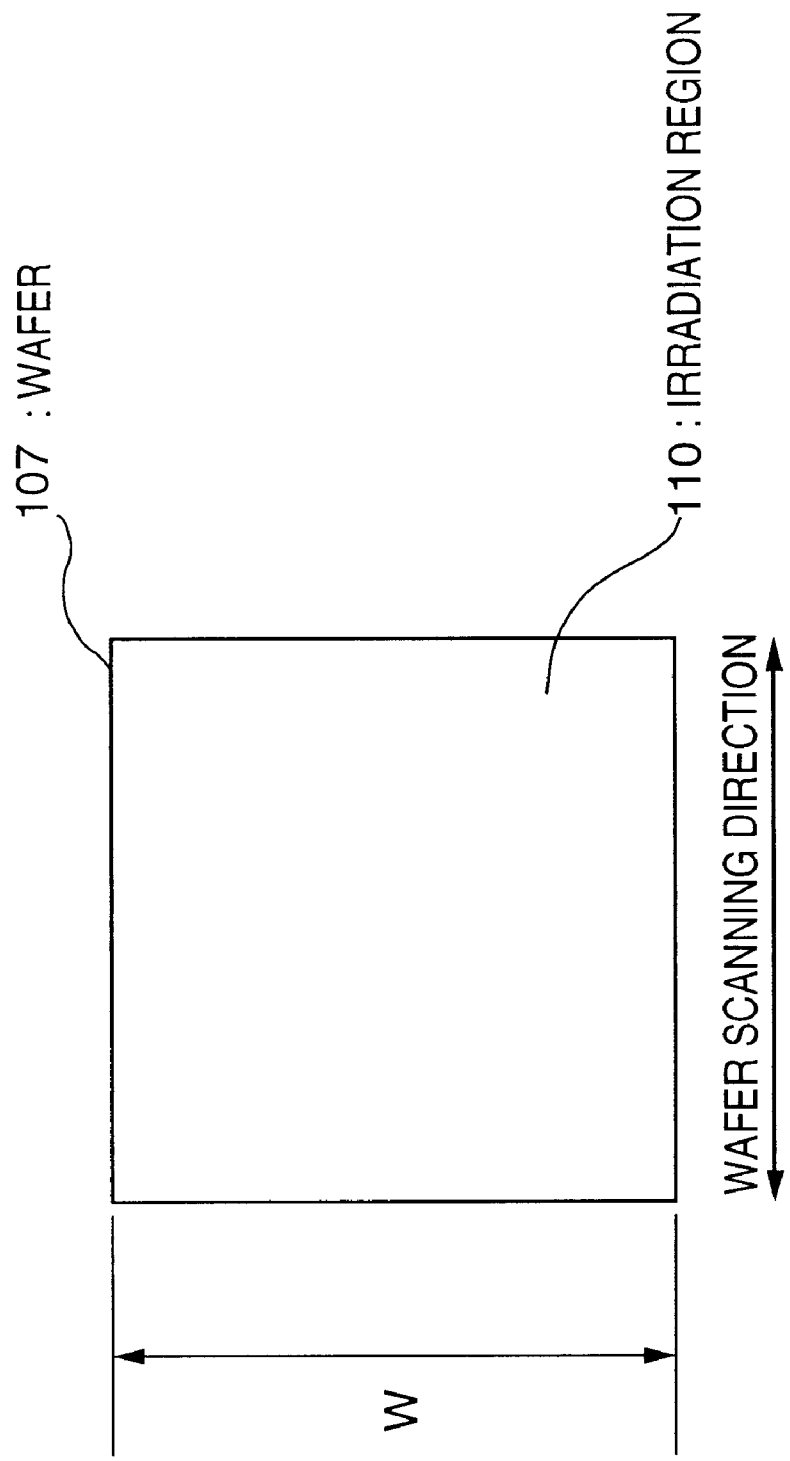
FIG. 8 is a view showing the irradiation region of an electron beam on a wafer in the electron beam projection exposure apparatus shown in FIG. 7.

The method of setting the intensity and distribution of the arcuated electron beam in the present invention will be explained below with reference to FIG. 6.

A ring-shaped electron beam originating from the electron gun 1 is shaped into an arcuated shape by the condenser lens 2 and slit 21. After the electron beam is transmitted through the field lens 3, the intensity and shape of the electron beam are measured by a current distribution measurement device 31 placed on the mask stage. As the current distribution measurement device 31, an array type multi-channel plate or two-dimensional photodiode array may be suitably used. A current distribution monitor 34 monitors the currently set size and intensity of the arcuated electron beam measured by the current distribution measurement device 31. If the relationship between the electron beam intensity (current density or the like) and the voltage detected by the current distribution measurement device 31 is measured in advance, an actual electron beam intensity can be measured.

The electron beam intensity can be set at a desired value when an electron gun bias circuit 33 changes the bias voltage to the electron gun 1 on the basis of the monitor result of the current distribution monitor 34, thereby setting a desired current density. On the other hand, the size of the arcuated electron beam can be desirably set when lens current drive control circuits 32 for the condenser lens 2 and field lens 3 are controlled on the basis of the monitor result of the current distribution monitor 34.

To restate, in the electron beam projection exposure apparatus of the present invention, since the electron emission surface of the electron source has a circularly recessed central portion, the peripheral portion of the electron emission surface emits a ring-shaped electron beam, which is used in exposure, thus removing any blur of an electron beam, and broadening the exposure region as compared to the prior art. Also, since the ring-shaped electron beam emitted from the peripheral portion of the electron emission surface has high brightness, the electron beam intensity required for exposure can be obtained even when the exposure region is broadened, thus realizing an electron beam projection exposure apparatus with high productivity.

Since the slit member is inserted between the electron gun and mask, the ring-shaped electron beam coming from the electron gun can be efficiently used. In this case, it is effective to use an arcuated slit.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus comprising:

an electron gun;

a slit member which is inserted between said electron gun and a mask, and has a slit for shaping a sectional shape of an electron beam emitted by said electron gun;

an electron optical system which is inserted between said electron gun and the mask and irradiates the electron beam transmitted through the slit onto the mask while magnifying an image of the electron beam transmitted through the slit to a predetermined size; and a projection lens for projecting, onto a wafer, the electron beam transmitted through the mask, wherein an intensity distribution of the electron beam emitted by said electron gun in a section perpendicular to an optical axis includes a ring-shaped region as a high intensity region.

2. The apparatus according to claim 1, wherein said electron gun has an electron source, an electron emission surface of which has a circularly recessed central portion.

3. The apparatus according to claim 1, wherein said electron gun has an electron source, an electron emission surface of which has a circularly recessed central portion and a ring-shaped peripheral portion.

4. The apparatus according to claim 1, wherein the slit has an arcuated shape.

5. The apparatus according to claim 1, wherein the slit has a shape defined by two arcs which substantially have the optical axis as a center.

6. The apparatus according to claim 1, wherein said electron optical system includes a condenser lens and field lens.

7. The apparatus according to claim 6, wherein said slit member is located in said condenser lens.

8. The apparatus according to claim 1, further comprising a control circuit for adjusting a size of the image of the electron beam irradiated onto the mask by controlling said electron optical system.

9. The apparatus according to claim 8, further comprising a measurement device for measuring a current distribution of the electron beam which becomes incident at a position of the mask, and wherein said control circuit operates on the basis of a measurement result of said measurement device.

10. The apparatus according to claim 1, further comprising a bias circuit for adjusting a bias voltage to be applied to said electron gun.

11. The apparatus according to claim 10, further comprising a measurement device for measuring a current distribution of the electron beam which becomes incident at a position of said mask, and wherein said bias circuit operates on the basis of a measurement result of said measurement device.

* * * * *

UNITED STATES PATENT AND TRADEMARK OFFICE
CERTIFICATE OF CORRECTION

PATENT NO. : 6,246,065 B1
DATED : June 12, 2001
INVENTOR(S) : Susumu Goto

It is certified that error appears in the above-identified patent and that said Letters Patent is hereby corrected as shown below:

Column 4,
Line 31, "5and" should read -- 5 and --.

Column 5,
Line 46, "gentangle of" should read -- gent angle of --.

Signed and Sealed this

First Day of January, 2002

Attest:

JAMES E. ROGAN
Attesting Officer     Director of the United States Patent and Trademark Office